United States Patent
Jia et al.

(10) Patent No.: US 10,868,275 B2
(45) Date of Patent: Dec. 15, 2020

(54) DISPLAY PANEL AND PREPARATION METHOD THEREOF

(71) Applicants: BEIJING BOE DISPLAY TECHNOLOGY CO., LTD., Beijing (CN); BOE TECHNOLOGY GROUP CO., LTD., Beijing (CN)

(72) Inventors: Yihe Jia, Beijing (CN); Xiangqian Ding, Beijing (CN); Xiaoxiang Zhang, Beijing (CN); Hao Han, Beijing (CN); Fangbin Fu, Beijing (CN); Yongzhi Song, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/638,273

(22) PCT Filed: Jun. 10, 2019

(86) PCT No.: PCT/CN2019/090546
§ 371 (c)(1),
(2) Date: Feb. 11, 2020

(87) PCT Pub. No.: WO2020/155511
PCT Pub. Date: Aug. 6, 2020

(65) Prior Publication Data
US 2020/0251687 A1    Aug. 6, 2020

(30) Foreign Application Priority Data
Feb. 2, 2019  (CN) .......................... 2019 1 0107534

(51) Int. Cl.
*H01L 51/52* (2006.01)
*H01L 51/56* (2006.01)

(52) U.S. Cl.
CPC ...... *H01L 51/5259* (2013.01); *H01L 51/5253* (2013.01); *H01L 51/56* (2013.01)

(58) Field of Classification Search
CPC .. H01L 51/5259; H01L 51/5253; H01L 51/56
See application file for complete search history.

(56) References Cited

U.S. PATENT DOCUMENTS

| 9,105,872 B2 | 8/2015 | Son |
| 2014/0179040 A1 | 6/2014 | Ramadas et al. |
| 2018/0166653 A1 | 6/2018 | Xie et al. |

FOREIGN PATENT DOCUMENTS

| CN | 106816549 A | 6/2017 |
| CN | 107349964 A | 11/2017 |

(Continued)

OTHER PUBLICATIONS

International Search Report dated Nov. 6, 2019, issued in counterpart Application No. PCT/CN2019/090546. (11 pages).

(Continued)

*Primary Examiner* — Anthony Ho
(74) *Attorney, Agent, or Firm* — Westerman, Hattori, Daniels & Adrian, LLP

(57) ABSTRACT

The present disclosure relates to a display panel. The display panel may include an OILED device and a package structure on the OLED device. The package structure may include a first water-oxygen absorbing layer comprising a first water-oxygen absorbing material. The first water-oxygen absorbing material may include first transition metal nanoparticles and a first metal organic framework coated on a surface of the first transition metal nanoparticles.

20 Claims, 8 Drawing Sheets

(56) References Cited

FOREIGN PATENT DOCUMENTS

| | | |
|---|---|---|
| CN | 108428805 A | 8/2018 |
| CN | 109244268 A | 1/2019 |
| CN | 109786579 A | 5/2019 |
| KR | 100684855 B1 | 2/2007 |

OTHER PUBLICATIONS

Office Action dated Oct. 30, 2019, issued in counterpart CN Application No. 201910107534.7, with English Translation. (18 pages).

Office Action dated May 21, 2020, issued in counterpart CN Application No. 201910107534.7, with English Translation. (19 pages).

DISPLAY PANEL AND PREPARATION METHOD THEREOF

CROSS-REFERENCE TO RELATED APPLICATION

This application claims benefit of the filing date of Chinese Patent Application No. 201910107534.7 filed on Feb. 2, 2019, the disclosure of which is hereby incorporated in its entirety by reference.

TECHNICAL FIELD

The present disclosure relates to the field of display technology, and in particular, to a display panel and a preparation method thereof.

BACKGROUND

OLED (Organic Light-Emitting Diode) display technology has been successfully commercialized after decades of development. It has shown great potential in high-definition display fields such as flexible and transparent display panel. At the same time, it has a very strong presence in the field of lighting.

At present, after the OLED display panel is fabricated, water vapor and oxygen still can enter the OLED device. After entering the OLED device, water and oxygen may react with material of a light-emitting layer, thereby resulting in denaturation of the light-emitting layer. As such, the service life of the OLED device could be significantly reduced.

BRIEF SUMMARY

One embodiment of the present disclosure provides a display panel. The display panel may include an OLED device and a package structure on the OLED device. The package structure may include a first water-oxygen absorbing layer comprising a first water oxygen absorbing material. The first water-oxygen absorbing material may include first transition metal nanoparticles and a first metal organic framework coated on a surface of the first transition metal nanoparticles.

Optionally, the first metal organic framework is formed from an organic ligand and a transition metal ion, and the first metal organic framework is bonded to a surface modifying material on the surface of the first transition metal nanoparticles.

Optionally, the transition metal ion is an ion of a same transition metal as that in the first transition metal nanoparticles.

Optionally, the first transition metal nanoparticles are cobalt nanoparticles and the surface modification material is polyvinylpyrrolidone.

Optionally, the package structure further comprises an encapsulation layer, and the first water-oxygen absorbing layer has a same pattern as the encapsulating layer.

Optionally, the first water-oxygen absorbing layer is on a side of the encapsulation layer facing the OLED device or on a side of the encapsulation layer opposite from the OLED device.

Optionally, the display panel further comprises a second water-oxygen absorbing layer, the second water-oxygen absorbing layer comprising a second water-oxygen absorbing material, the second water-oxygen absorbing material comprising second transition metal nanoparticles and a second metal organic framework coated on a surface of the second transition metal nanoparticles, and the second water-oxygen absorbing layer is on a side of the OLED device opposite from the package structure.

Optionally, the display panel comprises a flexible substrate, and the second water-oxygen absorbing layer is between the flexible substrate and the OLED device.

Optionally, the second transition metal nanoparticles are different from the first transition metal nanoparticles.

Optionally, the first transition metal nanoparticles are cobalt nanoparticles and the second transition metal nanoparticles are copper nanoparticles.

Optionally, the first organic metal framework has a porosity in a range of about 85% to about 90%.

One embodiment of the present disclosure is a method of preparing a display panel, comprising forming an OLED device on a substrate; and forming a package structure on a side of the OLED device opposite from the substrate, the package structure comprising an encapsulation layer and a first water-oxygen absorbing layer. The package structure comprises a first water-oxygen absorbing layer comprising a first water-oxygen absorbing material, the first water-oxygen absorbing material comprising first transition metal nanoparticles and a first metal organic framework coated on a surface of the first transition metal nanoparticles.

Optionally, forming the package structure comprises forming the encapsulation layer and the first water-oxygen absorbing layer by a same patterning process.

Optionally, the method of preparing the display panel, before forming the OLED device, further comprises forming a second water-oxygen absorbing layer. The second water-oxygen absorbing layer comprises a second water oxygen absorbing material, the second water-oxygen absorbing material comprising second transition metal nanoparticles and a second metal organic framework coated on a surface of the second transition metal nanoparticles.

Optionally, the first water-oxygen absorbing material is prepared by a method comprising mixing the first transition metal nanoparticles, a surface modification material, and a first polar organic solvent to obtain a first mixture solution; performing centrifugation on the first mixture solution to obtain the first transition metal nanoparticles coated with the surface modification material; and mixing and centrifuging the first transition metal nanoparticles coated with the surface modification material, an organic ligand, a transition metal ion, and an second polar organic solvent to obtain a composite material comprising the first metal organic framework and the first transition metal nanoparticles.

Optionally, the first transition metal nanoparticles are cobalt nanoparticles; and/or, the surface modifying material is polyvinylpyrrolidone; and/or, the first polar organic solvent is methanol.

Optionally, a mass ratio of the first transition metal nanoparticles to the surface modification material in the first mixture solution ranges from about 1:14 to about 1:24.

Optionally, after obtaining the first mixture solution and before performing centrifugation on the first mixture solution, the method for preparing the water-oxygen absorbing material further comprises adding a non-polar organic solvent to the first mixture solution.

Optionally, the non-polar organic solvent is n-hexane.

Optionally, a volume ratio of the non-polar organic solvent to the first polar organic solvent ranges from about 2:1 to about 4:1.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the present disclosure are apparent from the following detailed description taken in conjunction with the accompanying drawings in which:

DETAILED DESCRIPTION

Figure 1:
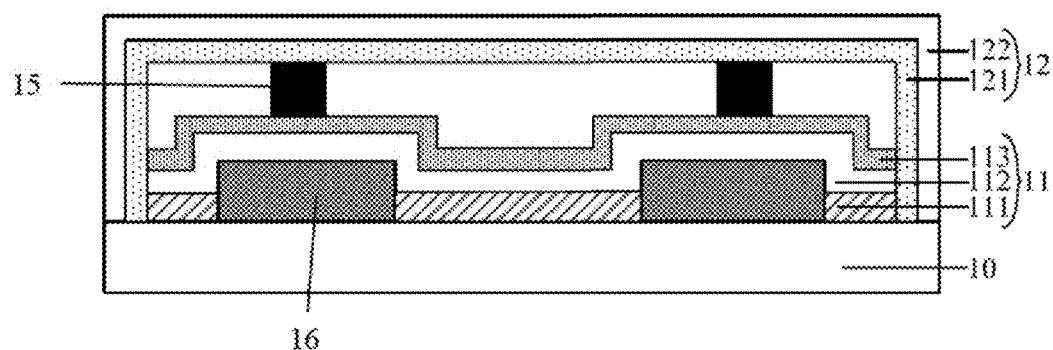
FIG. 1 is a schematic structural diagram of a display panel according to one embodiment of the present disclosure.

In order to make the objects, technical solutions, and advantages of the embodiments of the present disclosure more apparent, the technical solutions according to the embodiments of the present disclosure will be described below clearly and fully with reference to the drawings, but the embodiments described below are only particular embodiments, which are not intended to represent all embodiments of the present disclosure. Based upon the embodiments in the present disclosure, other embodiments which will be apparent to those skilled in the art are within the scope of the present disclosure.

When an element and an embodiment of the present disclosure are introduced, the articles "a", "an", "the" and "said" are intended to indicate that one or more elements are present. The terms "comprising", "including", "containing," and "having" are intended to be inclusive and mean that there may be additional elements other than the listed elements.

For the purpose of surface description hereinafter, as direction-calibrated in the accompanying drawings, the terms "above", "below", "left", "right", "vertical", "horizontal", "top", "bottom" and derivatives thereof shall relate to the present disclosure. The terms "covered with", "on top of", "positioned on", or "positioned on top of" mean that, for example, a first element of a first structure is on a second element of a second structure, wherein an intermediate element such as an intermediate structure may exist between the first element and the second element. The term "contact" means that, for example, the first element of the first structure and the second element of the second structure are connected directly or indirectly, and other elements may exist or not exist at the interface between the two elements.

Unless otherwise defined, all the terms (including the technical and scientific terms) used herein have the same meanings as commonly understood by one of ordinary skill in the art to which the present disclosure is directed. It is also understood that the terms such as defined in the usual dictionary should be interpreted as having the same meanings as the meaning in the context of the relevant technology. The terms should not be interpreted as an idealization or as having extreme meanings, unless they are explicitly defined herein. As employed herein, the statement that two or more parts are "connected" or "coupled" together shall mean that the parts are joined together either directly or joined through one or more intermediate parts.

In the description of the present disclosure, the terms "center," "horizontal," "vertical," "length," "width," "thickness," "upper," "lower," "front," "back," "left," "right," "top," "bottom," "inner," "outer," or the like are based on the orientation or positional relationship shown in the drawings. They are used merely for convenience of description and simplifying description of the present disclosure, but not to indicate or imply that the indicated apparatus or element must have a specific orientation, or be constructed and operated in a specific orientation, therefore cannot be construed as a limitation of the present disclosure.

In addition, the terms "first" and "second" or the like are for illustration purposes only and are not to be construed as indicating or implying relative importance or implied reference to the quantity of indicated technical features. Thus, features defined by the terms "first" and "second" may explicitly or implicitly include one or more of the features. In the description of the present disclosure, the meaning of "plural" is two or more unless otherwise specifically and specifically defined.

A numerical range modified by "about" herein means that the upper and lower limits of the numerical range can vary by 10% thereof. A numeric value modified by "about" herein means that the numeric value can vary by 10% thereof.

One embodiment of the present disclosure provides an OLED display panel. As shown in FIGS. 1-4, the OLED display panel includes a substrate 10, an OLED device 11 and a package structure 12 sequentially disposed on the substrate 10. The package structure 12 includes an encapsulation layer 122 and a first water-oxygen absorbing layer 121. The first water-oxygen absorbing layer 121 includes a first water-oxygen absorbing material. In some embodiments, as shown in FIG. 5, the first water-oxygen absorbing material comprises first transition metal nanoparticles and a first metal organic framework coated on a surface of the first transition metal nanoparticles. The first metal organic framework is bonded to a surface modifying material on the surface of the first transition metal nanoparticles.

The OLED device 11 includes, a first electrode 111, a light-emitting function layer 112 and a second electrode 113. When the first electrode 111 is an anode, the second electrode 113 is a cathode. When the first electrode 111 is a cathode, the second electrode 113 is an anode.

On this basis, the OLED device 11 may further include a hole transport layer and or a hole injection layer disposed between the anode and the light-emitting function layer 112, and an electron transport layer and/or an electron injection layer disposed between the cathode and the light-emitting function layer 112.

As shown in FIG. 1, the OLED device may further include spacers 15 used to separate the OLED stricture and upper protective layers. The material of the spacers 15 could be ZnO, which is transparent, insulating and has a good O2/H2O stability. The OLED device may further include TFT switches 16 which are used to control electrodes in OLED structure.

It should be noted that, first, the first transition metal nanoparticles, as the name suggests, may be nanoparticles of any transition metal among all transition metals such as cobalt (Co) nanoparticles, copper (Cu) nanoparticles, and the like.

Second, since the surface modification material is located on the surface of the first transition metal nanoparticles and the first metal organic framework is bonded to the surface modification material, the first metal organic framework is also located on the surface of the first transition metal nanoparticles.

Third, a first metal organic framework may coat only one first transition metal nanoparticle or a plurality of first transition metal nanoparticles, which depends on a specific method of preparing the water-oxygen absorbing material.

Fourth, the first metal organic framework is prepared from a transition metal ion and an organic ligand. Therefore, the metal in the first metal organic framework can be any transition metal.

On this basis, the metal in the first transition metal nanoparticles is also a transition metal. The transition metal of the first metal organic framework and the metal of the first transition metal nanoparticles may be the same transition metal or different transition metals.

In some embodiments, in order to save the preparation cost or the experimental cost, the transition metal of the first metal organic framework and the metal of the first transition metal nanoparticles are a same transition metal.

In one embodiment, the first transition metal nanoparticles are cobalt nanoparticles. The transition metal ion for preparing a first metal organic framework is a cobalt ion.

Fifth, the specific material for the surface modifying material is not limited as long as the surface modifying material can be bonded to the metal in the first metal organic framework such that the first metal organic framework is coated on the surface of the transition metal nanoparticles.

In one embodiment, the surface modification material is polyvinyl pyrrolidone (PVP).

Sixth, the encapsulation layer 122 is provided to prevent moisture and oxygen from entering the OLED device 11. Therefore, the encapsulation layer 122 needs to completely cover the upper surface and the side surfaces of the OLED device 11. Since the package structure 12 includes the encapsulation layer 122, the package structure 12 also completely covers the upper surface and the side surfaces of the OLED device 11.

Figure 2:
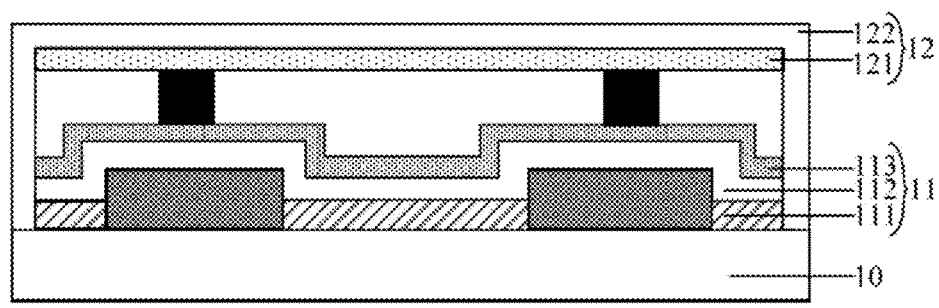
FIG. 2 is a schematic structural diagram of a display panel according to one embodiment of the present disclosure.

Seventh, in one embodiment, as shown in FIG. 1 and FIG. 2, the first water-oxygen absorbing layer 121 is disposed on the side of the encapsulation layer 122 facing the OLED device 11. In one embodiment, as shown in FIGS. 3 and 4, the first water oxygen absorbing layer 121 is disposed on the side of the encapsulation layer 122 opposite from the OLED device 11.

In one embodiment, considering that a small amount of moisture and oxygen may enter the OLED device 11 during the packaging process, the first water-oxygen absorbing layer 121 may be disposed on the side of the encapsulation layer 122 facing the OLED device 11. As such, the first water-oxygen absorbing layer 121 can also absorb the small amount of moisture and oxygen remaining in the OLED device 11 during the flow of the small amount of moisture and oxygen remaining in the OLED device 11.

Figure 3:
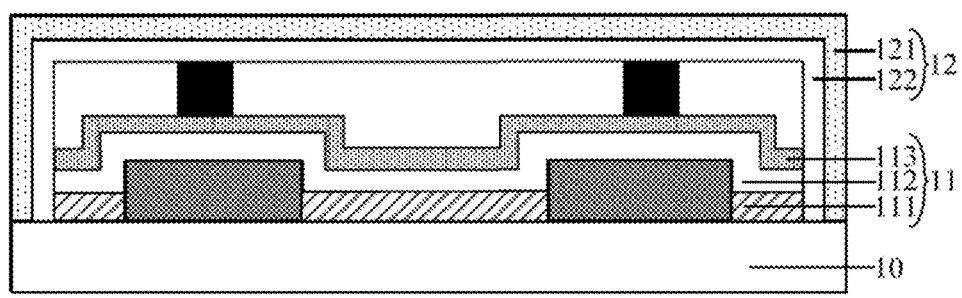
FIG. 3 is a schematic structural diagram of a display panel according to one embodiment of the present disclosure.

Eighth, as shown in FIGS. 1 and 3, the first water-oxygen absorbing layer 121 covers the upper surface and the side surfaces of the OLED device 11.

Figure 4:
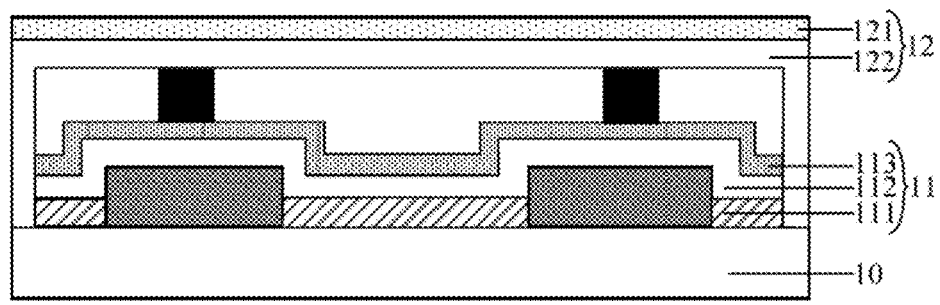
FIG. 4 is a schematic structural diagram of a display panel according to one embodiment of the present disclosure.
Figure 5:
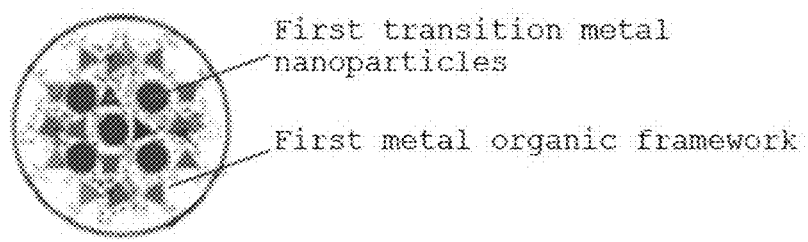
FIG. 5 is a schematic diagram of a water-oxygen absorbing material according to one embodiment of the present disclosure.

Alternatively, as shown in FIGS. 2 and 4, the first water-oxygen absorbing layer 121 covers only the upper surface of the OLED device 11.

Of course, the first water-oxygen absorbing layer 121 may also cover only the side surfaces of the OLED device 11.

One embodiment of the present disclosure provides a display panel. The display panel is provided with a package structure 12. The package structure 12 includes a first water-oxygen absorbing layer 121. The first water-oxygen absorbing layer 121 includes a first water-oxygen absorbing material. The first water-oxygen absorbing material is a composite material composed of first transition metal nanoparticles and a first metal organic framework coated on the surface of the first transition metal nanoparticles. Among them the first transition metal nanoparticles can react with oxygen to absorb oxygen. The first metal organic framework is a porous material, and can store the moisture in a plurality of pores, thereby absorbing the moisture. In one embodiment, the porosity of the first metal organic framework is in a range of about 75% to 95%, preferably about 85% to about 90%. Therefore, the first water-oxygen absorbing layer 121 according to one embodiment of the present disclosure can be used to block moisture and oxygen from entering the OLED device 11, thereby extending service life of the OLED device 11.

Optionally, the pattern of the first water-oxygen absorbing layer 121 is the same as the pattern of the encapsulation layer 122.

In one embodiment, the first water-oxygen absorbing layer 121 and the encapsulation layer 122 are prepared by the same patterning process. Alternatively, the first water-oxygen absorbing layer 121 and the encapsulation layer 122 are prepared by different patterning processes.

In one embodiment of the present disclosure, on the one hand, the pattern of the first water oxygen absorbing layer 121 is the same as the pattern of the encapsulating layer 122, and the first water-oxygen absorbing layer 121 can cover the OLED device 11 more comprehensively. On the other hand, the first water-oxygen absorbing layer 121 and the encapsulation layer 122 are prepared by the same patterning process, and the preparation process of the display panel can be simplified.

Figure 6:
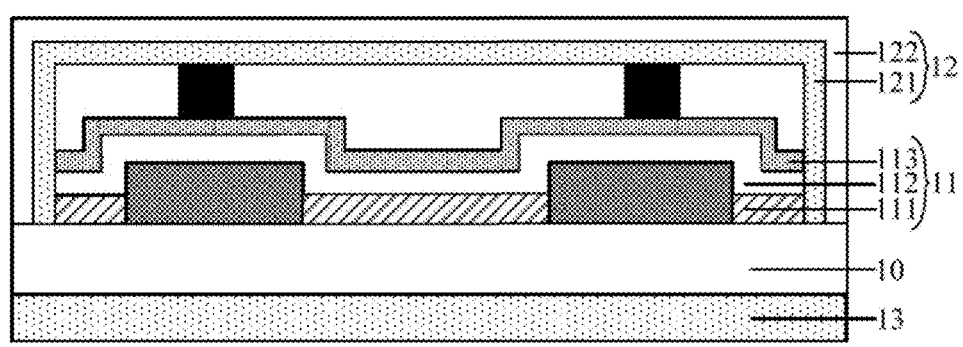
FIG. 6 is a schematic structural diagram of a display panel according to one embodiment of the present disclosure.
Figure 7:
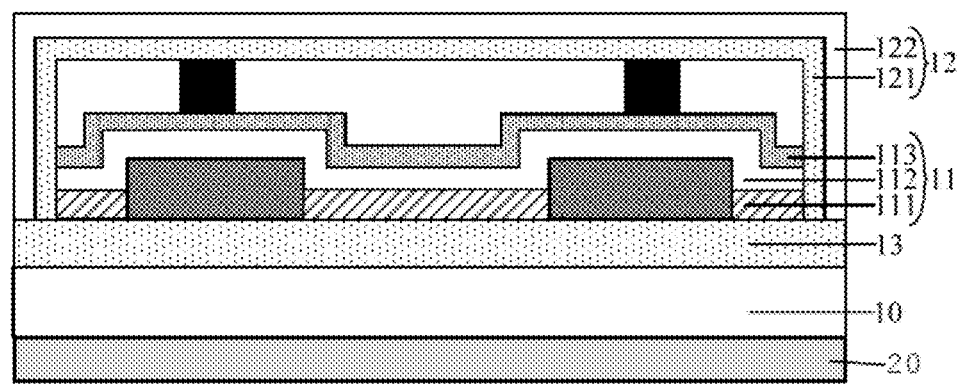
FIG. 7 is a schematic structural diagram of a display panel according to one embodiment of the present disclosure.

Optionally, as shown in FIG. 6 and FIG. 7, the display panel further includes a second water-oxygen absorbing layer 13 including a second water-oxygen absorbing material. In one embodiment, the second water-oxygen absorbing layer 13 is disposed on the side of the OLED device 11 opposite from the package structure 12.

It should be noted that, first, the second water-oxygen absorbing layer 13 also includes a second water-oxygen absorbing material. That is, the second water-oxygen absorbing layer 13 also includes second transition metal nanoparticles and a second metal organic framework coated on the surface of the second transition metal nanoparticles. Therefore, the second water-oxygen absorbing layer 13 can also absorb moisture and oxygen to prevent the moisture and oxygen from entering the OLED device 11.

Second, the second water-oxygen absorbing material in the second water-oxygen absorbing layer 13 may be identical to or different from the first water-oxygen absorbing material in the first water oxygen absorbing layer 121.

In one embodiment, the second water-oxygen absorbing material in the second water-oxygen absorbing layer 13 is different from the first water-oxygen absorbing material in the first water absorbing layer 121. For example, the first transition metal nanoparticles in the first water-oxygen absorbing layer 121 are cobalt nanoparticles, and the second transition metal nanoparticles in the second water-oxygen absorbing layer 13 are copper nanoparticles.

Third, in one embodiment, as shown in FIG. 5, the second water-oxygen absorbing layer 13 is disposed on the side of the substrate 10 opposite from the OLED device 11. Alternatively, as shown in FIG. 7, the second water-oxygen absorbing layer 13 is disposed between the substrate 10 and the OLED device 11.

In one embodiment of the present disclosure, by providing the second water-oxygen absorbing layer 13 on the side of the OLED device 11 opposite from the package structure 12, moisture and oxygen can be prevented from entering the OLED device 11 from the side of the substrate 10.

Further optionally, as shown in FIG. 7, the display panel is a flexible OLED display panel. The second water-oxygen absorbing layer 13 is disposed between the substrate 10 and the OLED device 11.

The material of the substrate 10 in the flexible OLED display panel may be, for example, polyimide (PI).

In one embodiment of the present disclosure, in consideration of preparing a flexible OLED display panel, the flexible substrate needs to be placed on a rigid substrate 20. After the flexible OLED display panel is prepared, the flexible OLED display panel is peeled off from the rigid substrate 20. Thus, as shown in FIG. 7, by disposing the second water-oxygen absorbing layer 13 between the substrate 10 and the OLED device 11, it is possible to avoid damaging the second water-oxygen absorbing layer 13 during the process of peeling off the flexible OLED display panel from the rigid substrate 20, which would otherwise results in the second water-oxygen absorbing layer 13 not functioning to absorb sufficient moisture and oxygen.

The material of the rigid substrate 20 may be, for example, glass. The manner of peeling off the flexible OLED display panel from the rigid substrate 20 may be, for example, laser stripping.

Figure 8:
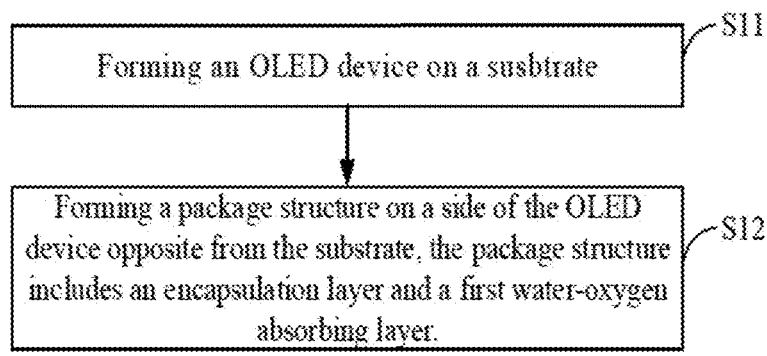
FIG. 8 is a flow chart of a method of preparing a display panel according to one embodiment of the present disclosure.
Figure 9:
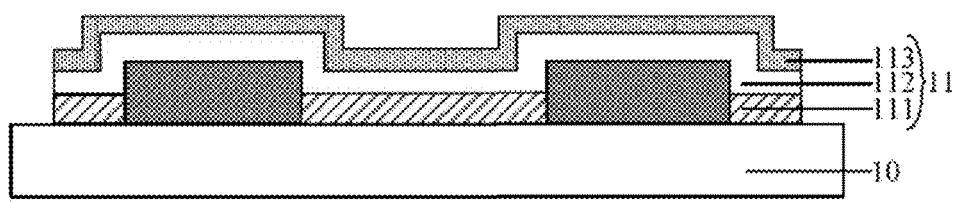
FIG. 9 is a schematic diagram of a method of preparing a display panel according to one embodiment of the present disclosure.

One embodiment of the present disclosure further provides a method for preparing an OLED display panel, as shown in FIG. 8, which can be specifically implemented by the following steps:

In step S11, as shown in FIG. 9, an OLED device 11 is formed on the substrate 10.

First, a first electrode 111 is formed on the substrate 10. Thereafter, a light-emitting function layer 112 is formed on the substrate 10 on which the first electrode 111 was formed. Finally, a second electrode 113 is formed on the substrate 10 on which the light-emitting function layer 112 was formed.

When the first electrode 111 is an anode, the second electrode 113 is a cathode. When the first electrode 111 is a cathode, the second electrode 113 is an anode.

In one embodiment, the OLED device 11 may further include a hole transport layer and/or a hole injection layer disposed between the anode and the light-emitting function layer 112, and an electron transport layer and/or an electron injection layer disposed between the cathode and the light-emitting function layer 112.

In one embodiment, the method further includes forming a pixel defining layer on the substrate 10.

In step S12, as shown in FIG. 1-4, a package structure 12 is formed on a side of the OLED device 11 opposite from the substrate 10. The package structure 12 includes an encapsulation layer 122 and a first water-oxygen absorbing layer 121.

Wherein, as shown in FIG. 5, the first water-oxygen absorbing layer 121 comprises a first water-oxygen absorbing material. The first water-oxygen absorbing material comprises first transition metal nanoparticles and a first metal organic framework coated on the surface of the first transition metal nanoparticles. The first metal organic framework is bonded to a surface modification material on the surface of the first transition metal nanoparticles. The transition metal in the first transition metal nanoparticles is the same as the metal in the first metal organic framework.

It should be noted that, first, those skilled in the art should know that the encapsulation layer 122 is disposed to prevent moisture and oxygen from entering the OLED device 11. Therefore, the encapsulation layer 122 needs to completely cover the upper surface and the side surfaces of the OLED device 11. Since the package structure 12 includes the encapsulation layer 122, the package structure 12 also completely covers the upper surface and the side surfaces of the OLED device 11.

Second, as shown in FIG. 1 and FIG. 2, the first water-oxygen absorbing layer 121 is formed first, and then the encapsulation layer 122 is formed. Alternatively, as shown in FIG. 3 and FIG. 4, the encapsulation layer 12 is formed first, and then the first water-oxygen absorbing layer 121 is formed.

In one embodiment, considering that a small amount of moisture and oxygen may enter the OLED device 11 during the packaging process, the first water-oxygen absorbing layer 121 may be formed first. Then, the encapsulation layer 122 may be formed. In this way, the first water-oxygen absorbing layer 121 can absorb the small amount of moisture and oxygen remaining in the OLED device 11 during the flow of the small amount of moisture and oxygen remaining in the OLED device 11.

Third, as shown in FIGS. 1 and 3, the first water-oxygen absorbing layer 121 is formed on the upper surface and the side surfaces of the OLED device 11. Alternatively, as shown in FIGS. 2 and 4, the first water-oxygen absorbing layer 121 is formed only on the upper surface of the OLED device 11.

Of course, the first water-oxygen absorbing layer 121 may also be formed only on the side surfaces of the OLED device 11.

Fourth, first transition metal nanoparticles, as the name implies, may be nanoparticles of any transition metal, such as cobalt nanoparticles, copper nanoparticles, etc.

Fifth, since the surface modification material is located on the surface of the first transition metal nanoparticles and the first metal organic framework is bonded to the surface modification material, the first metal organic framework is also located on the surface of the transition metal nanoparticles.

Sixth, a first metal organic framework may coat only one first transition metal nanoparticle or a plurality of first transition metal nanoparticles, which depends on a specific method of preparing the first water-oxygen absorbing material.

Seventh, the first metal organic framework is prepared from a transition metal ion and an organic ligand. Therefore, the metal in the first metal organic framework may be any transition metal.

On this basis, the metal in the first transition metal nanoparticles is also a transition metal. The transition metal of the first metal organic framework and the metal of the first transition metal nanoparticles may be the same transition metal or different transition metals.

In one embodiment, in order to save the preparation cost or the experimental cost, the transition metal of the first metal organic framework and the metal of the first transition metal nanoparticles are the same transition metal. For example, the first transition metal nanoparticles are cobalt nanoparticles. The transition metal ion used to prepare the first metal organic framework is cobalt ion.

Eighth, the specific material of the surface modifying material is not limited as long as the surface modifying material can be bonded to the metal in the first metal organic framework so that the first metal organic framework is coated on the surface of the first transition metal nanoparticles.

In one embodiment, the surface modifying material is polyvinylpyrrolidone.

One embodiment of the present disclosure provides a method for preparing a display panel. The package structure 12 is formed on the OLED device 11. The package structure 12 includes a first water-oxygen absorbing layer 121, and the first water-oxygen absorbing layer 121 includes a first water-oxygen absorbing material. The first water-oxygen absorbing material is a composite material composed of first transition metal nanoparticles and a first metal organic framework coated on the surface of the first transition metal nanoparticles. The first transition metal nanoparticles can react with oxygen to absorb oxygen. The first metal organic framework is a porous material which can store moisture in a plurality of pores to absorb the moisture. Therefore, the first water-oxygen absorbing layer 121 of the embodiment of the present disclosure can block moisture and oxygen from entering the OLED device 11, thereby extending the useful life of the OLED device 11.

Optionally, forming the package structure 12 includes: forming the encapsulation layer 122 and the first water-oxygen absorption layer 121 by the same patterning process.

In some embodiments of the present disclosure, on the one hand, the pattern of the first water-oxygen absorbing layer 121 is the same as the pattern of the encapsulating layer 122. As such, the first water-oxygen absorbing layer 121 can cover the OLED device 11 more completely. On the other hand, the first water-oxygen absorbing layer 121 and the encapsulation layer 122 are prepared by the same patterning process. As such, the preparation process of the display panel can also be simplified.

Figure 10:
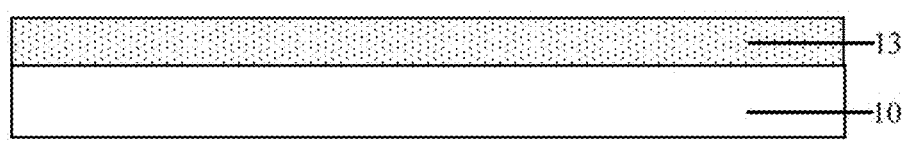
FIG. 10 is a schematic diagram of a method of for preparing a display panel according to one embodiment of the present disclosure.

Optionally, as shown in FIG. 10, before forming the OLED device 11, the method further comprises: forming a second water-oxygen absorbing layer 13, and the second water oxygen absorbing layer 13 comprises a second water-oxygen absorbing material.

It should be noted that, first, since the second water-oxygen absorbing layer 13 also includes the second water-oxygen absorbing material. That is, the second water-oxygen absorbing layer 13 also includes second transition metal nanoparticles and a second metal organic framework coated on the surface of the second transition metal nanoparticles. Therefore, the second water-oxygen absorbing layer 13 can also absorb water vapor and oxygen to prevent moisture and oxygen from entering the OLED device 11.

Second, the second water-oxygen absorbing material in the second water-oxygen absorbing layer 13 may be identical to or different from the first water-oxygen absorbing material in the first water-oxygen absorbing layer 121.

In one embodiment, when the second water-oxygen absorbing material in the second water-oxygen absorbing layer 13 is different from the first water-oxygen absorbing material in the first water-oxygen absorbing layer 121, the first transition metal nanoparticles in the first water-oxygen absorbing layer 121 are cobalt nanoparticles, and the second transition metal nanoparticles in the second water-oxygen absorbing layer 13 are copper nanoparticles.

Third, in one embodiment, as shown in FIG. 6, the OLED device 11 is formed on the side of the substrate 10 opposite from the second water-oxygen absorbing layer 13. In another embodiment, as shown in FIG. 7, the OLED device 11 is formed on the side of the second water-oxygen absorbing layer 13 opposite from the substrate 10.

In one embodiment of the present disclosure, by forming the second water-oxygen absorbing layer 13 before forming the OLED device 11, moisture and oxygen can be prevented from entering the OLED device 11 from the side of the substrate 10.

Figure 11:
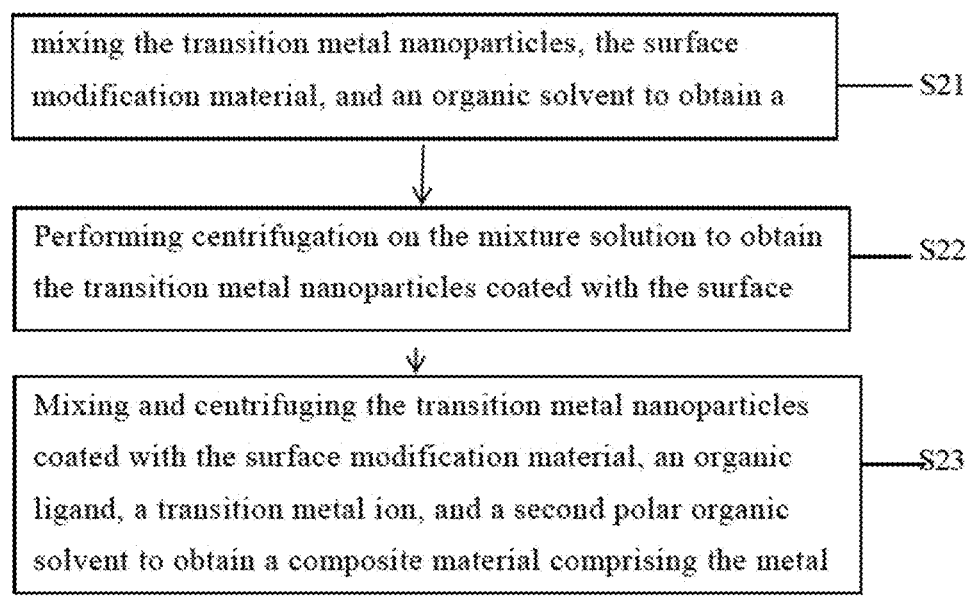
FIG. 11 is a flowchart of a method of preparing a display panel according to one embodiment of the present disclosure.

Optionally, the method for preparing the first water-oxygen absorbing material is as shown in FIG. 11, and the method includes the following steps:

Step S21 includes uniformly mixing the first transition metal nanoparticles and the surface modifying material in a first polar organic solvent to obtain a first mixture solution.

Wherein, after the first transition metal nanoparticles are mixed with the surface modifying material, the surface modifying material is coated on the surface of the first transition metal nanoparticles.

It should be noted that, first, the specific type of the polar organic solvent is not limited as long as the surface modification material can be coated on the surface of the first transition metal nanoparticles in the first polar organic solvent and then the first mixture solution can be centrifuged subsequently. In one embodiment, the first polar organic solvent is methanol.

Second, the mass ratio of the first transition metal nanoparticles to the surface modification material is not limited as long as the surface modification material can completely cover the surface of the first transition metal nanoparticles.

Optionally, the mass ratio of the first transition metal nanoparticles to the surface modification material ranges from 1:14 to 1:24 to ensure that the surface modification material is excessive compared to the first transition metal nanoparticles without wasting material.

In one embodiment, the mass ratio of the first transition metal nanoparticles to the surface modifying material is 1:19.

Step S22 includes performing centrifugation on the first mixture solution to obtain the first transition metal nanoparticles coated with the surface modifying material.

During the centrifugation of the first mixture solution, since the density of the first transition metal nanoparticles coated with the surface modification material is greater than the density of the first polar organic solvent, the first transition metal nanoparticles coated with the surface modification material are settled down. Then, the liquid is poured off, and the first transition metal nanoparticles coated with the surface modification material are obtained.

Here, the poured liquid includes the first polar organic solvent. On the basis of this, in the case where the surface modifying material is excessive, the poured liquid further includes the surface modifying material which is not coated on the surface of the first transition metal nanoparticles.

Step S23 includes uniformly mixing the first transition metal nanoparticles coated with the surface modification material, an organic ligand, a transition metal ion and a second polar organic solvent to obtain a second mixture solution, and performing centrifugation of the second mixture solution to obtain a composite material composed of the first metal organic framework and the first transition metal nanoparticles.

Figure 12:
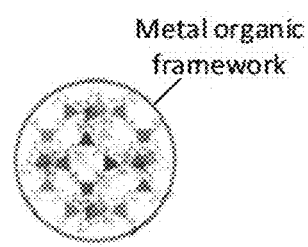
FIG. 12 is a schematic diagram of a metal organic framework according to one embodiment of the present disclosure.

During this process, the organic ligand reacts with the transition metal ions to form the first metal organic framework shown in FIG. 12. Since the surface modification material can be bonded to the metal in the first metal organic framework, as shown in FIG. 5, the finally obtained first metal organic framework is coated on the surface of the first transition metal nanoparticles.

It should be noted that, first, the material of the organic ligand is not limited as long as the organic ligand can react with the transition metal ion to form a first metal organic framework. Specifically, the organic ligand is related to the material used to form the transition metal ion of the metal organic framework.

Optionally, assuming that the transition metal ion is a cobalt ion, such as cobalt nitrate ($Co(NO_3)_2$), the organic ligand may be 2-methylimidazole.

In the embodiment of the present disclosure, the composite material including the first metal organic framework and the first transition metal nanoparticles is finally obtained by two centrifugation processes.

Further, the method for preparing the water-oxygen absorbing material further comprises: adding a non-polar organic solvent to the first mixture solution after the first mixture solution is obtained and before the first mixture solution is subjected to the centrifugation.

It should be noted that, in the first process, the solute is first transition metal nanoparticles and a surface modification material coated on the surface of the first transition metal nanoparticles, and the solvent is a mixture of a non-polar organic solvent and a polar organic solvent. The specific type of the non-polar organic solvent is not limited as long as the surface modification material can be coated on the surface of the first transition metal nanoparticles in a mixed solvent of the non-polar organic solvent and the polar organic solvent, and the non-polar organic solvent facilitates extracting the solute in the first mixture solution in the subsequent process.

In one embodiment, the non-polar organic solvent is n-hexane.

Second, the volume ratio of the non-polar organic solvent to the polar organic solvent is not limited, as long as the addition of the non-polar organic solvent facilitates extracting the solute from the first mixture solution.

Optionally, the volume ratio of the non-polar organic solvent to the polar organic solvent ranges from 2:1 to 4:1 to ensure efficient extraction of the solute in the first mixture solution without wasting material.

In one embodiment, the volume ratio of the non-polar organic solvent to the polar organic solvent is 3:1.

In one embodiment of the present disclosure, since the solute includes first transition metal nanoparticles and a surface modification material coated on the surface of the first transition metal nanoparticles when the first mixture solution is centrifuged, the density difference between the solute and the polar organic solvent is not large, and accordingly it may be difficult to perform the centrifugal treatment of the first mixture solution. Therefore, using the function of a non-polar organic solvent, addition of the non-polar organic solvent can facilitate more efficiently extracting the solute in the first mixture solution, thereby improving the centrifugation effect.

In one embodiment, the first water-oxygen absorbing material is prepared as follows: first, 1 g of Co NCs and polyvinylpyrrolidone (PVP) were placed in 40 mL of methanol, and stirred under Ar atmosphere for 24 hours. Then, n-hexane was added for centrifugation to obtain surface-modified Co NCs. Then, the surface modified Co NCs were mixed with $Co(NO_3)$ (1 mmol/dm$^3$) and 2-methylimidazole (4 mmol/dm$^3$) into 50 mL of methanol to obtain a suspension. Finally, the suspension is stirred under Ar atmosphere for 24 h, then centrifuged, and washed several times with ethanol to obtain the first water-oxygen absorbing material.

The principles and the embodiments of the present disclosure are set forth in the specification. The description of the embodiments of the present disclosure is only used to help understand the apparatus and method of the present disclosure and the core idea thereof. Meanwhile, for a person of ordinary skill in the art, the disclosure relates to the scope of the disclosure, and the technical scheme is not limited to the specific combination of the technical features, but also covers other technical schemes which are formed by combining the technical features or the equivalent features of the technical features without departing from the inventive concept. For example, a technical scheme may be obtained by replacing the features described above as disclosed in this disclosure (but not limited to) with similar features.

What is claimed is:

1. A display panel, comprising:
 an OLED device; and
 a package structure on the OLED device,
 wherein the package structure comprises a first water-oxygen absorbing layer comprising a first water-oxygen absorbing material, the first water-oxygen absorbing material comprising first transition metal nanoparticles and a first metal organic framework coated on a surface of the first transition metal nanoparticles.

2. The display panel of claim 1, wherein the first metal organic framework is formed from an organic ligand and a transition metal ion, and the first metal organic framework is bonded to a surface modifying material on the surface of the first transition metal nanoparticles.

3. The display panel of claim 2, wherein the transition metal ion is an ion of a same transition metal as that in the first transition metal nanoparticles.

4. The display panel of claim 2, wherein the first transition metal nanoparticles are cobalt nanoparticles and the surface modification material is polyvinylpyrrolidone.

5. The display panel of claim 1, wherein the package structure further comprises an encapsulation layer, and the first water-oxygen absorbing layer has a same pattern as the encapsulating layer.

6. The display panel of claim 5, wherein the first water-oxygen absorbing layer is on a side of the encapsulation layer facing the OLED device or on a side of the encapsulation layer opposite from the OLED device.

7. The display panel of claim 1, further comprising a second water-oxygen absorbing layer, the second water-oxygen absorbing layer comprising a second water-oxygen absorbing material, the second water-oxygen absorbing material comprising second transition metal nanoparticles and a second metal organic framework coated on a surface of the second transition metal nanoparticles, and
 the second water-oxygen absorbing layer is on a side of the OLED device opposite from the package structure.

8. The display panel of claim 7, wherein the display panel comprises a flexible substrate, and
 the second water-oxygen absorbing layer is between the flexible substrate and the OLED device.

9. The display panel of claim 7, wherein the second transition metal nanoparticles are different from the first transition metal nanoparticles.

10. The display panel of claim 9, wherein the first transition metal nanoparticles are cobalt nanoparticles and the second transition metal nanoparticles are copper nanoparticles.

11. The display panel of claim 1, wherein the first organic metal framework has a porosity in a range of about 85% to about 90%.

12. A method of preparing a display panel, comprising:
forming an OLED device on a substrate; and
forming a package structure on a side of the OLED device opposite from the substrate, the package structure comprising an encapsulation layer and a first water-oxygen absorbing layer;
wherein the package structure comprises a first water-oxygen absorbing layer comprising a first water-oxygen absorbing material, the first water-oxygen absorbing material comprising first transition metal nanoparticles and a first metal organic framework coated on a surface of the first transition metal nanoparticles.

13. The method of preparing the display panel of claim 12, wherein forming the package structure comprises forming the encapsulation layer and the first water-oxygen absorbing layer by a same patterning process.

14. The method of preparing the display panel of claim 12, before forming the OLED device, further comprising:
forming a second water-oxygen absorbing layer,
wherein the second water-oxygen absorbing layer comprises a second water oxygen absorbing material, the second water-oxygen absorbing material comprising second transition metal nanoparticles and a second metal organic framework coated on a surface of the second transition metal nanoparticles.

15. The method of preparing the display panel of claim 12, wherein the first water-oxygen absorbing material is prepared by a method comprising:
mixing the first transition metal nanoparticles, a surface modification material, and a first polar organic solvent to obtain a first mixture solution;
performing centrifugation on the first mixture solution to obtain the first transition metal nanoparticles coated with the surface modification material; and
mixing and centrifuging the first transition metal nanoparticles coated with the surface modification material, an organic ligand, a transition metal ion, and an second polar organic solvent to obtain a composite material comprising the first metal organic framework and the first transition metal nanoparticles.

16. The method of preparing the display panel of claim 15, wherein the first transition metal nanoparticles are cobalt nanoparticles; and/or, the surface modifying material is polyvinylpyrrolidone; and/or, the first polar organic solvent is methanol.

17. The method of preparing the display panel of claim 14, wherein a mass ratio of the first transition metal nanoparticles to the surface modification material in the first mixture solution ranges from about 1:14 to about 1:24.

18. The method of preparing the display panel of claim 15, after obtaining the first mixture solution and before performing centrifugation on the first mixture solution, the method for preparing the water-oxygen absorbing material further comprises:
adding a non-polar organic solvent to the first mixture solution.

19. The method of preparing the display panel of claim 18, wherein the non-polar organic solvent is n-hexane.

20. The method of preparing the display panel of claim 18, wherein a volume ratio of the non-polar organic solvent to the first polar organic solvent ranges from about 2:1 to about 4:1.

* * * * *